United States Patent
Furuya et al.

(10) Patent No.: US 8,869,092 B2
(45) Date of Patent: Oct. 21, 2014

(54) WIRING INSPECTION APPARATUS AND WIRING INSPECTION METHOD

(71) Applicant: Fujitsu Limited, Kawasaki (JP)

(72) Inventors: Akiko Furuya, Yokohama (JP); Nobuaki Kawasoe, Yokohama (JP); Koji Migita, Kawasaki (JP); Masato Oota, Atsugi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/146,752

(22) Filed: Jan. 3, 2014

(65) Prior Publication Data

US 2014/0289696 A1    Sep. 25, 2014

(30) Foreign Application Priority Data

Mar. 25, 2013 (JP) ................................. 2013-063088

(51) Int. Cl.
*G06F 17/50* (2006.01)
(52) U.S. Cl.
CPC .................................. *G06F 17/5081* (2013.01)
USPC ............................ 716/136; 716/111; 716/131
(58) Field of Classification Search
None
See application file for complete search history.

(56) References Cited

U.S. PATENT DOCUMENTS 5,999,716 A   12/1999   Toyonaga

FOREIGN PATENT DOCUMENTS

| JP | 62-139342 | 6/1987 |
|----|-----------|--------|
| JP | 02-045957 | 2/1990 |
| JP | 02-060148 | 2/1990 |
| JP | 04-085959 | 3/1992 |
| JP | 04-142096 | 5/1992 |
| JP | 05-29460  | 2/1993 |
| JP | 10-74842  | 3/1998 |

*Primary Examiner* — Leigh Garbowski
(74) *Attorney, Agent, or Firm* — Fujitsu Patent Center

(57) ABSTRACT

A wiring inspection apparatus includes a dividing unit, a calculating unit, and an output unit. The dividing unit draws a boundary line in a predetermined area between a transmission component and a reception component, to divide the predetermined area into a first area containing the transmission component and a second area containing the reception component. The transmission component transmits a signal to the reception component via relay components. The calculating unit calculates a number of wirings that connect the components across the boundary line, based on positions of the transmission component, the reception component, and the relay components in the predetermined area. The output unit outputs information indicating the presence of a wiring extending in a direction opposite to a direction from the transmission component to the reception component, when the number of the wirings calculated by the calculating unit is equal to or greater than a predetermined value.

5 Claims, 9 Drawing Sheets

WIRING INSPECTION APPARATUS AND WIRING INSPECTION METHOD

CROSS-REFERENCE TO RELATED APPLICATION(S)

This application is based upon and claims the benefit of priority of the prior Japanese Patent Application No. 2013-063088, filed on Mar. 25, 2013, the entire contents of which are incorporated herein by reference.

FIELD

The embodiments discussed herein are directed to a wiring inspection apparatus and a wiring inspection method.

BACKGROUND

There is a technology for designing circuits by using an electronic design automation (EDA) tool, such as a computer aided design (CAD) tool. For example, the EDA tool enables automatic wiring between two cells (for example, a latch, a flip-flop, and the like) that are designated to be connected. In recent years, in the physical design of a circuit, the number of cases is increasing, in which a timing problem occurs due to the presence of a bypass wiring extending in a direction opposite to a direction of approach from a cell that transmits a signal to a cell that receives the signal among wirings from the cell that transmits the signal to the cell that receives the signal. The reason why the number of the cases with the timing problem is increasing is that, in recent years, the operating frequencies of circuits have increased and the density of the circuits has increased due to the miniaturization of technologies.

In a circuit with the timing problem, operation is sometimes not performed normally. Therefore, conventionally, a wiring inspection method has been proposed to inspect whether there is a bypass wiring, in order to detect a circuit that does not operate normally. As an example of the wiring inspection method, there is a method in which a human visually inspects a circuit after wiring. As another example of the wiring inspection method, there is a method in which a computer inspects whether there is a bypass wiring based on a wiring pattern of a circuit after wiring. As for an example of the conventional techniques, see Japanese Laid-open Patent Publication No. 10-74842 and Japanese Laid-open Patent Publication No. 05-29460, for example.

However, in the wiring inspection method as described above, in some cases, inspection is sometimes not performed in a simple and easy manner. For example, in the method in which a human visually inspects a circuit after wiring, it takes a long time for a human to inspect more than thousands of wirings. Therefore, in the method in which a human visually inspects a circuit after wiring, it is difficult to perform the inspection in a simple and easy manner. Furthermore, in the method in which a computer inspects whether there is a bypass wiring based on a wiring pattern of a circuit after wiring, the same problem occurs. Specifically, in the method in which a computer inspects whether there is a bypass wiring, a wiring pattern is analyzed based on data indicating the wiring pattern, and whether there is a bypass wiring is inspected based on the analyzed wiring pattern. Therefore, it takes a long time to analyze the wiring pattern and inspect whether there is a bypass wiring based on the analyzed wiring pattern. Consequently, even in the method in which the computer inspects whether there is a bypass wiring based on a wiring pattern of a circuit after wiring, it is difficult to perform the inspection in a simple and easy manner.

SUMMARY

According to an aspect of an embodiment, a wiring inspection apparatus includes a dividing unit, a calculating unit, and an output unit. The dividing unit draws a boundary line in a portion of a predetermined area between a transmission component and a reception component that are arranged in the predetermined area, to divide the predetermined area into a first area containing the transmission component and a second area containing the reception component. The transmission component is configured to transmit a signal to the reception component via a plurality of relay components. The calculating unit calculates a number of wirings that connect the components across the boundary line, based on positions of the transmission component, the reception component, and the relay components in the predetermined area. The output unit outputs information indicating presence of a wiring extending in a direction opposite to a direction from the transmission component to the reception component among wirings connecting the components when the number of the wirings calculated by the calculating unit is equal to or greater than a predetermined value.

According to another aspect of an embodiment, a non-transitory computer-readable recording medium has stored therein a program that causes a computer to execute a wiring inspection process. The wiring inspection process includes: drawing a boundary line in a portion of a predetermined area between a transmission component and a reception component that are arranged in the predetermined area, dividing the predetermined area into a first area containing the transmission component and a second area containing the reception component, the transmission component configured to transmit a signal to the reception component via a plurality of relay components; calculating a number of wirings that connect the components across the boundary line, based on positions of the transmission component, the reception component, and the relay components in the predetermined area; and determining that there is a wiring extending in a direction opposite to a direction from the transmission component to the reception component among wirings connecting the components when the number of the wirings calculated at the calculating is equal to or greater than a predetermined value.

According to still another aspect of an embodiment, a wiring inspection method performed by a computer, includes: drawing, by the computer, a boundary line in a portion of a predetermined area between a transmission component and a reception component that are arranged in the predetermined area, dividing the predetermined area into a first area containing the transmission component and a second area containing the reception component, the transmission component configured to transmit a signal to the reception component via a plurality of relay components; calculating, by the computer, a number of wirings that connect the components across the boundary line, based on positions of the transmission component, the reception component, and the relay components in the predetermined area; and determining, by the computer, that there is a wiring extending in a direction opposite to a direction from the transmission component to the reception component among wirings connecting the components when the number of the wirings calculated at the calculating is equal to or greater than a predetermined value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The present invention is not limited to the embodiments below.

[a] First Embodiment

Figure 1:
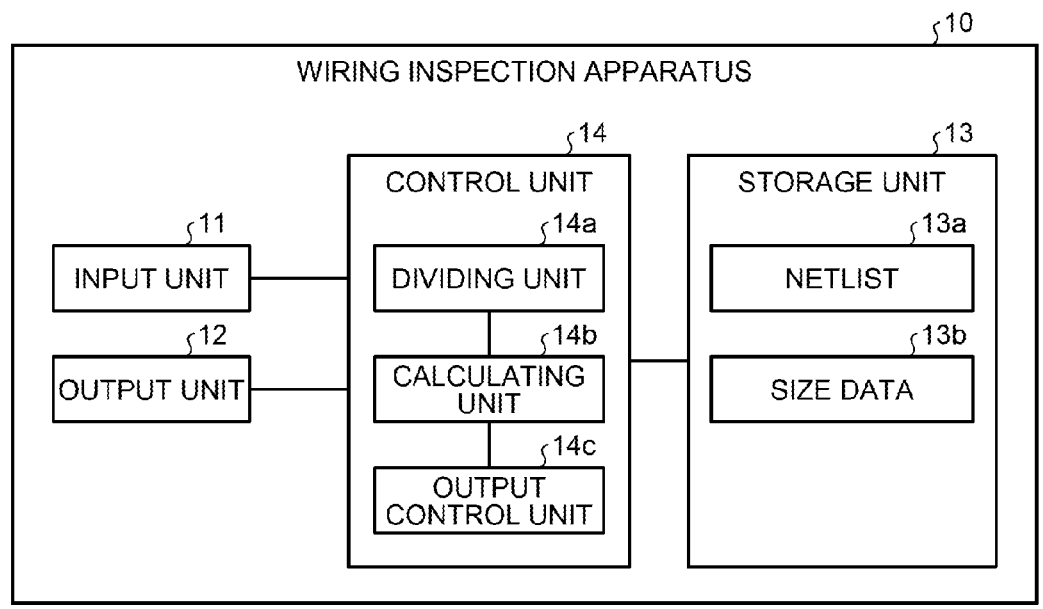
FIG. 1 is a diagram illustrating an example of a functional configuration of a wiring inspection apparatus according to a first embodiment.

A wiring inspection apparatus according to a first embodiment will be explained. FIG. 1 is a diagram illustrating an example of a functional configuration of the wiring inspection apparatus according to the first embodiment.

Functional Configuration of the Wiring Inspection Apparatus

As illustrated in FIG. 1, a wiring inspection apparatus 10 includes an input unit 11, an output unit 12, a storage unit 13, and a control unit 14.

The input unit 11 inputs various types of information to the control unit 14. For example, the input unit 11 receives an instruction to perform a wiring inspection process (to be described later) from a user, and inputs the received instruction to the control unit 14. An example of a timing at which the user inputs the instruction to perform the wiring inspection process to the control unit 14 via the input unit 11 will be explained below. Examples of the timing include a timing at which a cell is temporarily arranged, a timing at which a clock tree is generated, and a timing at which temporary wiring is performed, in a physical design flow (to be described later). Namely, in the physical design flow, the wiring inspection apparatus 10 according to the first embodiment can perform the wiring inspection process before performing detailed wiring. The reason why the wiring inspection process can be performed before the detailed wiring is that, as will be described later, the wiring inspection apparatus 10 can inspect whether there is a bypass wiring based on the positional relationship of cells, without using wiring pattern data indicating a wiring pattern. As an example of a device serving as the input unit 11, a device, such as a mouse or a keyboard, that receives user operation may be employed.

The output unit 12 outputs various types of information. For example, the output unit 12 displays a message indicating the presence of a bypass wiring under the control of an output control unit 14c (to be described later). Examples of the message include a message of "There is a bypass wiring. A wiring (XXX) is the bypass wiring". Meanwhile, "XXX" is an identifier for identifying a wiring, and may be, for example, a wiring name or a position coordinate. Furthermore, the output unit 12 displays a message indicating the absence of a bypass wiring under the control of the output control unit 14c (to be described later). Examples of the message include a message of "There is no bypass wiring". As an example of a device serving as the output unit 12, a liquid crystal display may be employed.

The storage unit 13 stores therein various types of information. For example, the storage unit 13 stores therein netlist 13a and size data 13b. The netlist 13a is connection information on cells at a gate level. The netlist 13a contains connection information on cells for each net. Meanwhile, the "net" indicates connection between a cell serving as a starting point for outputting a signal and a cell serving as an end point for receiving the signal. The netlist 13a is generated at each stage (each step) of a flowchart of FIG. 9 that illustrates the flow of a physical design (to be described later).

The size data 13b is data indicating the size of a physical design area. The physical design area is an area in which each cell is arranged in a circuit physical design.

The storage unit 13 is a storage device such as a semiconductor memory device including a flash memory, or a storage device such as a hard disk or an optical disk. The storage unit 13 is not limited to the storage device as described above, and may be a random access memory (RAM) or a read only memory (ROM).

The control unit 14 includes an internal memory for storing programs that defines flows of various processes or for storing control data, and performs the various processes with the programs and data. As illustrated in FIG. 1, the control unit 14 includes a dividing unit 14a, a calculating unit 14b, and the output control unit 14c.

The dividing unit 14a divides a physical design area, in which a cell of a transmitting-side flip-flop (FF) that transmits a signal to a cell of a receiving-side flip-flop via cells of a plurality of latches are arranged and in which the cell of the receiving-side flip-flop and the cells of the latches are also arranged, in a manner as described below. Specifically, the dividing unit 14a draws a boundary line in a portion of the physical design area between the cell of the transmitting-side flip-flop and the cell of the receiving-side flip-flop, to thereby divide the physical design area into an area A containing the cell of the transmitting-side flip-flop and an area B containing the cell of the receiving-side flip-flop.

An example of the dividing unit 14a will be explained below. For example, when an instruction to perform a wiring inspection process (to be described later) is input to the control unit 14 via the input unit 11, the dividing unit 14a performs processes as described below. Specifically, the dividing unit 14a acquires the size data 13b from the storage unit 13. Subsequently, the dividing unit 14a sets a variable Fin to the coordinate of the origin of a cell of a flip-flop that serves as a starting point for transmitting a signal and that is arranged in the physical design area with a size indicated by the size data 13b. Incidentally, the origin of the cell of the flip-flop is, for example, a point indicated by the minimum X coordinate and the minimum Y coordinate of the cell of the flip-flop. Furthermore, the dividing unit 14a sets a variable Fout to the coordinate of the origin of a cell of a flip-flop that serves as an end point for receiving the signal and that is arranged in the physical design area with the size indicated by the size data 13b.

Then, the dividing unit 14a draws a boundary line passing through a midpoint between the cell of the flip-flop serving as the starting point for transmitting a signal and the cell of the flip-flop serving as the end point for receiving the signal in the physical design area. Therefore, the dividing unit 14a divides the physical design area into the area A containing the cell of the flip-flop serving as the starting point and the area B containing the cell of the flip-flop serving as the end point.

Figure 2:
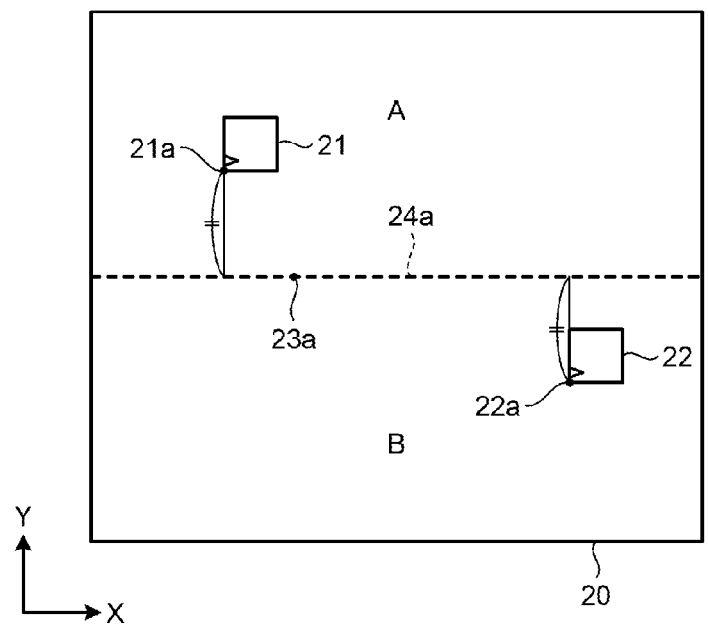
FIG. 2 is a diagram for explaining an example of a process for dividing a physical design area.

FIG. 2 is a diagram for explaining an example of a process for dividing the physical design area. In the example in FIG. 2, a cell 21 of a flip-flop serving as a starting point for transmitting a signal and a cell 22 of a flip-flop serving as an end point for receiving the signal are arranged in a physical design area 20. Meanwhile, in the example in FIG. 2, illustration of cells of a plurality of latches or the like arranged between the cell 21 and the cell 22 is omitted. Furthermore, in the example in FIG. 2, the horizontal axis serves as the X-axis and the vertical axis serves as the Y-axis. In the example in FIG. 2, the dividing unit 14a draws a boundary line 24a such that a distance from an origin 21a of the cell 21 and a distance from an origin 22a of the cell 22 to the boundary line 24a become the same, to thereby divide the physical design area 20 into the area A containing the cell 21 and the area B containing the cell 22. Incidentally, the boundary line 24a is a line that passes through a midpoint 23a between the origin 21a and the origin 22a in the Y-axis direction and that is parallel to the X-axis. The position of the midpoint 23a is not limited to the position illustrated in FIG. 2, and an arbitrary position corresponding to the position of the midpoint between the origin 21a and the origin 22a in the Y-axis direction may be employed.

Figure 3:
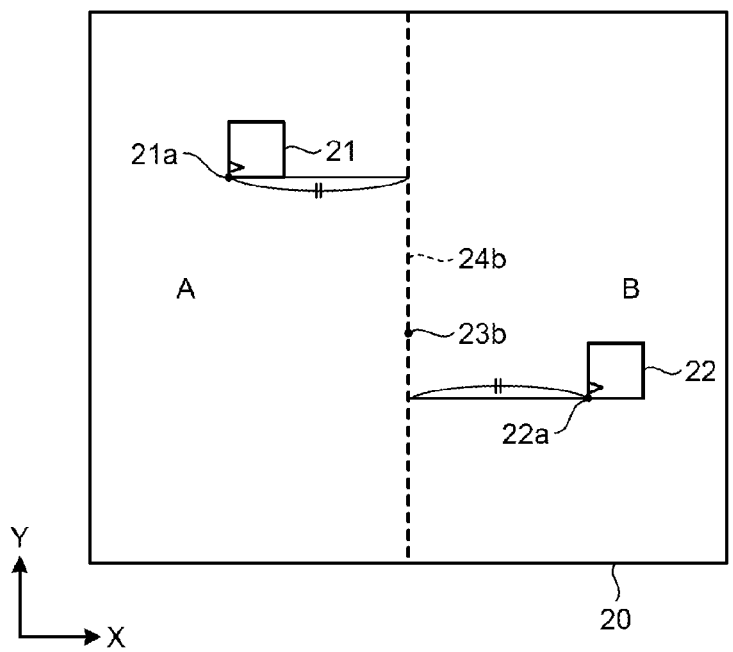
FIG. 3 is a diagram for explaining another example of the process for dividing the physical design area.
Figure 4:
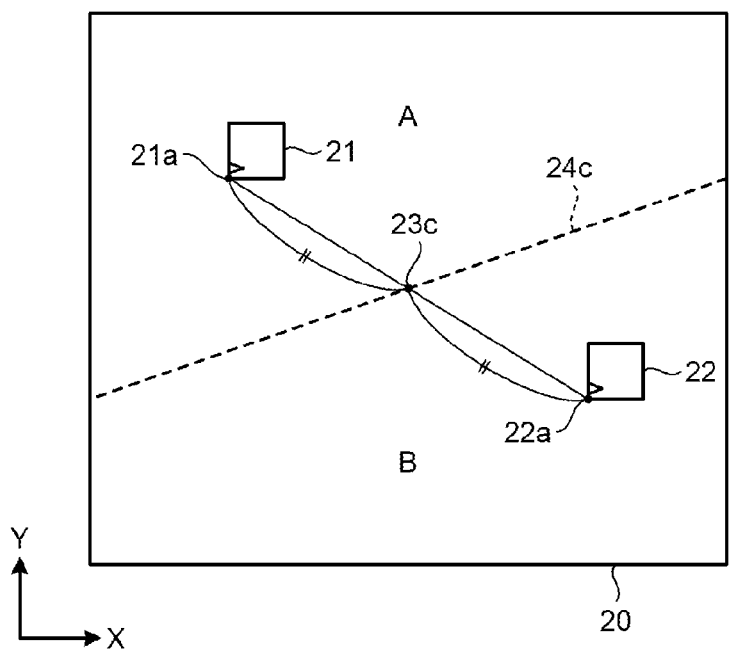
FIG. 4 is a diagram for explaining still another example of the process for dividing the physical design area.

FIG. 3 and FIG. 4 are diagrams for explaining other examples of the process for dividing the physical design area. In the example in FIG. 3, the cell 21 and the cell 22 are arranged in the physical design area 20. Meanwhile, in the example in FIG. 3, illustration of cells of a plurality of latches or the like arranged between the cell 21 and the cell 22 is omitted. Furthermore, in the example in FIG. 3, the horizontal axis serves as the X-axis and the vertical axis serves as the Y-axis. In the example in FIG. 3, the dividing unit 14a draws a boundary line 24b such that a distance from the origin 21a of the cell 21 and a distance from the origin 22a of the cell 22 to the boundary line 24b become the same, to thereby divide the physical design area 20 into the area A containing the cell 21 and the area B containing the cell 22. Incidentally, the boundary line 24b is a line that passes through a midpoint 23b between the origin 21a and the origin 22a in the X-axis direction and that is parallel to the Y-axis. The position of the midpoint 23b is not limited to the position illustrated in FIG. 3, and an arbitrary position corresponding to the position of the midpoint between the origin 21a and the origin 22a in the X-axis direction may be employed.

In the example in FIG. 4, the cell 21 and the cell 22 are arranged in the physical design area 20. Meanwhile, in the example in FIG. 4, illustration of cells of a plurality of latches or the like arranged between the cell 21 and the cell 22 is omitted. Furthermore, in the example in FIG. 4, the horizontal axis serves as the X-axis and the vertical axis serves as the Y-axis. In the example in FIG. 4, the dividing unit 14a draws a boundary line 24c such that a distance from the origin 21a of the cell 21 and a distance from the origin 22a of the cell 22 to the boundary line 24c become the same, to thereby divide the physical design area 20 into the area A containing the cell 21 and the area B containing the cell 22. Incidentally, the boundary line 24c is a line that passes through a midpoint 23c of a segment connecting the origin 21a and the origin 22a.

Subsequently, the dividing unit 14a sets a variable N to "0". Meanwhile, the value of the variable N indicates, for example, the number of times that the wirings connecting the cells cross the above-described boundary line. The value of the variable N is updated by the calculating unit 14b (to be described later).

Figure 5:
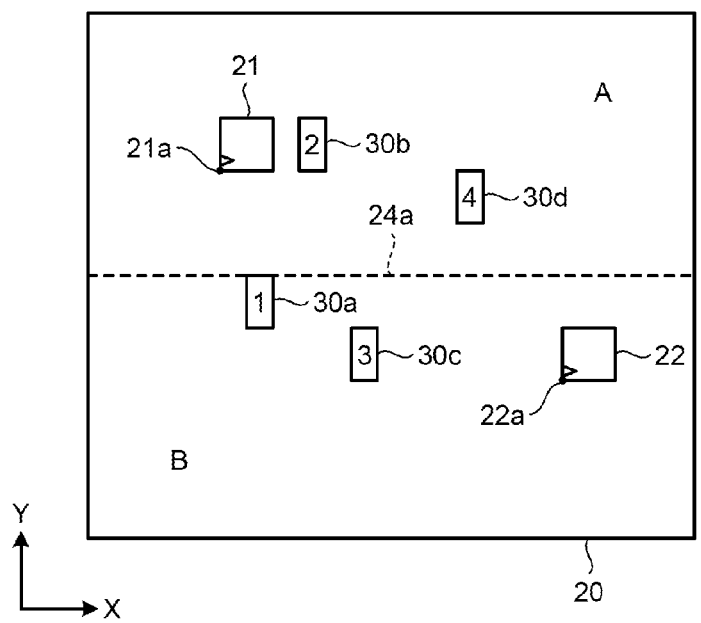
FIG. 5 is a diagram for explaining an example of a process performed by the wiring inspection apparatus according to the first embodiment.

The dividing unit 14a sets a variable Pin to an identifier of either the area A or the area B containing the cell with the coordinate indicated by the variable Fin (the coordinate of the origin of the cell of the flip-flop serving as the starting point for transmitting a signal). FIG. 5 is a diagram for explaining an example of the process performed by the wiring inspection apparatus according to the first embodiment. In the example in FIG. 5, the cell 21 and the cell 22 are arranged in the physical design area 20. Furthermore, in the example in FIG. 5, four cells 30a to 30d of latches or the like are arranged between the cell 21 and the cell 22. Moreover, in the example in FIG. 5, the horizontal axis serves as the X-axis and the vertical axis serves as the Y-axis. Furthermore, the number assigned to each of the cells 30a to 30d in the example in FIG. 5 indicates the order of flow of a signal through the cells 30a to 30d. Specifically, FIG. 5 illustrates an example in which a signal flows through the cell 21, the cell 30a, the cell 30b, the cell 30c, the cell 30d, and the cell 22 in this order. In the example in FIG. 5, the area A, out of the areas A and B, contains the coordinate indicated by the variable Fin (the coordinate of the origin 21a of the cell 21). Therefore, in the example in FIG. 5, the dividing unit 14a sets the variable Pin to an identifier "A" of the area A containing the coordinate of the origin 21a.

Referring back to FIG. 1, the calculating unit 14b performs processes as described below, based on the position of the cell of the flip-flop serving as the starting point for transmitting a signal, the position of the cell of the flip-flop serving as the end point for receiving the signal, and the positions of the cells of the latches or the like in the physical design area. Specifically, the calculating unit 14b calculates the number of wirings that connect cells across the boundary line.

An example of the calculating unit 14b will be explained below. The calculating unit 14b performs processes as described below when the dividing unit 14a sets the variable Pin to the identifier of either the area A or the area B containing the coordinate indicated by the variable Fin. Specifically, the calculating unit 14b selects a single cell that has not been selected from among a plurality of cells. As a way to select a single cell that has not been selected, the calculating unit 14b selects a single cell located on the most upstream side in the signal flow direction from among cells that have not been selected. Then, the calculating unit 14b sets a variable Cout to the coordinate of the origin of a cell next to the selected cell, that is, the coordinate of the origin of a cell to which the signal flows next from the selected cell. For example, in the example illustrated in FIG. 5, if the cell 21 is selected, the calculating unit 14b sets the variable Cout to the coordinate of the origin of the cell 30a next to the selected cell 21.

Then, the calculating unit 14b sets a variable Pout to the identifier of either the area A or the area B containing the coordinate indicated by the variable Cout. For example, in the example illustrated in FIG. 5, if the variable Cout indicates the coordinate of the origin of the cell 30a, the calculating unit 14b sets the variable Pout to an identifier "B" of the area B, out of the areas A and B, that contains the coordinate of the origin of the cell 30a.

Subsequently, the calculating unit 14b determines whether the set value of the variable Pin and the set value of the variable Pout match each other. In this case, if the set value of the variable Pin and the set value of the variable Pout match each other, the selected cell and the cell next to the selected cell are located in the same single area A or B. In contrast, if the set value of the variable Pin and the set value of the variable Pout do not match each other, the selected cell and the cell next to the selected cell are not located in the same single area A or B. For example, in the example illustrated in FIG. 5, if the set value of the variable Pin is "A" and the set value of the variable Pout is "B", the calculating unit 14b determines that the set value "A" of the variable Pin and the set value "B" of the variable Pout do not match each other. Specifically, the calculating unit 14b determines that the selected cell 21 and the cell 30a next to the selected cell 21 are not located in the same single area A or B.

If the set value of the variable Pin and the set value of the variable Pout do not match each other, the calculating unit 14b increments the value of the variable N by "1", to thereby update the value of the variable N. For example, in the example illustrated in FIG. 5, when it is determined that the set value "A" of the variable Pin and the set value "B" of the variable Pout do not match each other, the calculating unit 14b increments the value of the variable N by "1".

If the set value of the variable Pin and the set value of the variable Pout do not match each other and the value of the variable N is incremented by "1", the calculating unit 14b sets the variable Pin to the value of the variable Pout. For example, in the example illustrated in FIG. 5, when the value of the variable N is incremented by "1" and the set value of the variable Pout is "B", the calculating unit 14b sets the variable Pin to the set value "B" of the variable Pout, to thereby update the value of the variable Pin with "B".

Then, the calculating unit 14b compares the value of the variable N and a predetermined value to determine whether the value of the variable N is equal to or greater than the predetermined value. As an example of the predetermined value compared with the value of the variable N, a value that enables to detect the presence of a bypass wiring, for example, "2", is employed.

If the value of the variable N is not equal to or greater than the predetermined value, the calculating unit 14b determines whether the set coordinate of the variable Cout matches the set coordinate of the variable Fout (the coordinate of the origin of the cell of the flip-flop serving as the end point for receiving the signal). In this case, if the set coordinate of the variable Cout matches the set coordinate of the variable Fout, the cell next to the selected cell is the cell of the flip-flop serving as the end point for receiving the signal. In contrast, if the set coordinate of the variable Cout does not match the set coordinate of the variable Fout, the cell next to the selected cell is located on the upstream side of the cell of the flip-flop serving as the end point for receiving the signal, in the signal flow direction.

If the set coordinate of the variable Cout does not match the set coordinate of the variable Fout, the calculating unit 14b performs processes as described below. Specifically, the calculating unit 14b re-performs all of the processes from the process of selecting a single cell that has not been selected to the process of determining whether the set coordinate of the variable Cout matches the set coordinate of the variable Fout.

The calculating unit 14b repeats the above processes until the set coordinate of the variable Cout matches the set coordinate of the variable Fout, and thereafter performs processes as described below. Specifically, the calculating unit 14b repeats all of the processes from the process of selecting a single cell that has not been selected to the process of determining whether the set coordinate of the variable Cout matches the set coordinate of the variable Fout. As described above, the calculating unit 14b determines whether a wiring connecting the selected cell and the cell next to the selected cell crosses the boundary line every time the calculating unit 14b selects a cell in the upstream side in the signal flow direction, and, if the wiring crosses the boundary line, the calculating unit 14b increments the value of the variable N by "1". Therefore, the calculating unit 14b can calculate the number of wirings crossing the boundary line.

Referring back to FIG. 1, if the calculating unit 14b determines that the value of the variable N is equal to or greater than the predetermined value, the output control unit 14c performs a process as described below. Specifically, the calculating unit 14b determines that there is a bypass wiring and causes the output unit 12 to output a message indicating the presence of a bypass wiring among the wirings connecting the cells. For example, the output control unit 14c causes the output unit 12 to display a message of "There is a bypass wiring. A wiring (XXX) is the bypass wiring".

Furthermore, if the calculating unit 14b determines that the set coordinate of the variable Cout matches the set coordinate of the variable Fout, the output control unit 14c performs a process as described below. Specifically, the output control unit 14c determines that there is no bypass wiring and causes the output unit 12 to output a message indicating the absence of a bypass wiring among the wirings connecting the cells. For example, the output control unit 14c causes the output unit 12 to display a message of "There is no bypass wiring".

Figure 6:
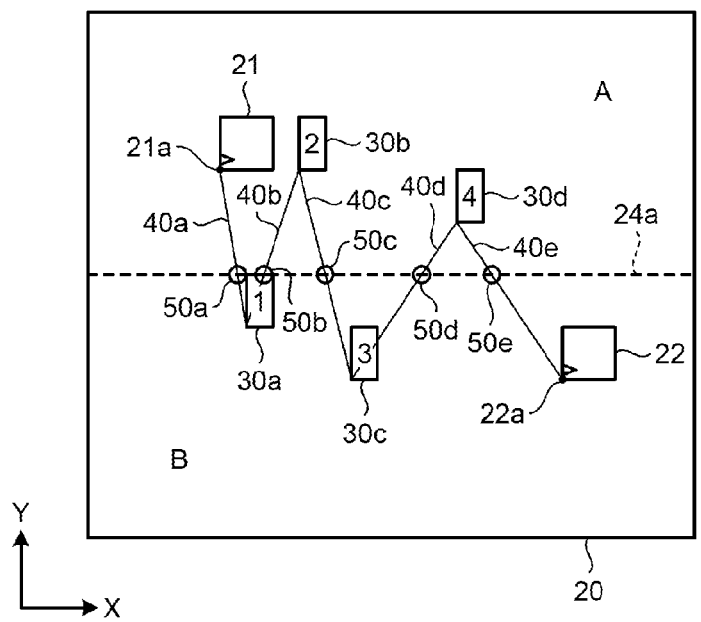
FIG. 6 is a diagram for explaining an example of the process performed by the wiring inspection apparatus according to the first embodiment.
Figure 7:
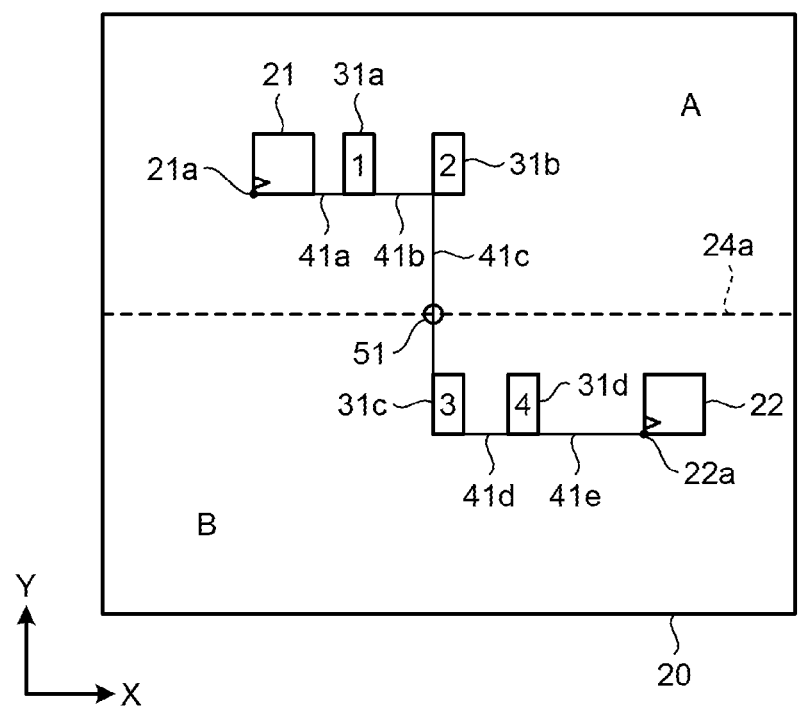
FIG. 7 is a diagram for explaining an example of the process performed by the wiring inspection apparatus according to the first embodiment.

FIG. 6 and FIG. 7 are diagrams for explaining examples of processes performed by the wiring inspection apparatus according to the first embodiment. In the example in FIG. 6, the cell 21 and the cell 22 are arranged in the physical design area 20. Furthermore, in the example in FIG. 6, the four cells 30a to 30d of latches or the like are arranged between the cell 21 and the cell 22. Moreover, in the example in FIG. 6, the horizontal axis serves as the X-axis and the vertical axis serves as the Y-axis. Furthermore, the number assigned to each of the cells 30a to 30d in the example in FIG. 6 indicates the order of flow of a signal through the cells 30a to 30d. Specifically, FIG. 6 illustrates an example in which a signal flows through the cell 21, the cell 30a, the cell 30b, the cell 30c, the cell 30d, and the cell 22 in this order.

In the example in FIG. 6, the cell 21 and the cell 30a are connected via a wiring 40a. Furthermore, in the example in FIG. 6, the cell 30a and the cell 30b are connected via a wiring 40b. Moreover, in the example in FIG. 6, the cell 30b and the cell 30c are connected via a wiring 40c. Furthermore, in the example in FIG. 6, the cell 30c and the cell 30d are connected via a wiring 40d. Moreover, in the example in FIG. 6, the cell 30d and the cell 22 are connected via a wiring 40e.

In the example in FIG. 6, the wirings 40a to 40d cross the boundary line 24a at five portions 50a to 50e on the boundary line 24a. In the example illustrated in FIG. 6, if the predetermined value to be compared with the variable N as described above is set to "2", the wiring inspection apparatus 10 including the dividing unit 14a, the calculating unit 14b, and the output control unit 14c performs processes as described below. Specifically, the wiring inspection apparatus 10 determines that there is a bypass wiring upon detecting that the wirings 40a and 40b cross the boundary line 24a at the two portions 50a and 50b among the five portions 50a to 50e. As described above, if there is a bypass wiring among the wirings connecting the cells arranged in the physical design area 20, the wiring inspection apparatus 10 can determine the presence of a bypass wiring without performing the determination for all of the wirings about whether the wirings cross the boundary line. Therefore, the wiring inspection apparatus 10 can determine the presence of a bypass wiring with a simpler process than in the case where the determination on whether the wirings cross the boundary line is performed for all of the wirings.

In the example in FIG. 7, the cell 21 and the cell 22 are arranged in the physical design area 20. Furthermore, in the example in FIG. 7, four cells 31a to 31d of latches or the like are arranged between the cell 21 and the cell 22. Moreover, in the example in FIG. 7, the horizontal axis serves as the X-axis and the vertical axis serves as the Y-axis. Furthermore, the number assigned to each of the cells 31a to 31d in the example in FIG. 7 indicates the order of flow of a signal through the cells 31a to 31d. Specifically, FIG. 7 illustrates an example in which a signal flows through the cell 21, the cell 31a, the cell 31b, the cell 31c, the cell 31d, and the cell 22 in this order.

In the example in FIG. 7, the cell 21 and the cell 31a are connected via a wiring 41a. Furthermore, in the example in FIG. 7, the cell 31a and the cell 31b are connected via a wiring 41b. Moreover, in the example in FIG. 7, the cell 31b and the cell 31c are connected via a wiring 41c. Furthermore, in the example in FIG. 7, the cell 31c and the cell 31d are connected via a wiring 41d. Moreover, in the example in FIG. 7, the cell 31d and the cell 22 are connected via a wiring 41e.

In the example in FIG. 7, the wiring 41c crosses the boundary line 24a at one portion 51 on the boundary line 24a. In the example illustrated in FIG. 7, if the predetermined value to be compared with the variable N as described above is set to "2", the wiring inspection apparatus 10 performs processes as described below. Specifically, the wiring inspection apparatus 10 determines that there is no bypass wiring because the number of wirings crossing the boundary line 24a is one.

The control unit 14 is a circuit, such as an application specific integrated circuit (ASIC), a field programmable gate array (FPGA), a central processing unit (CPU), or a micro processing unit (MPU).

Flow of Process

Figure 8:
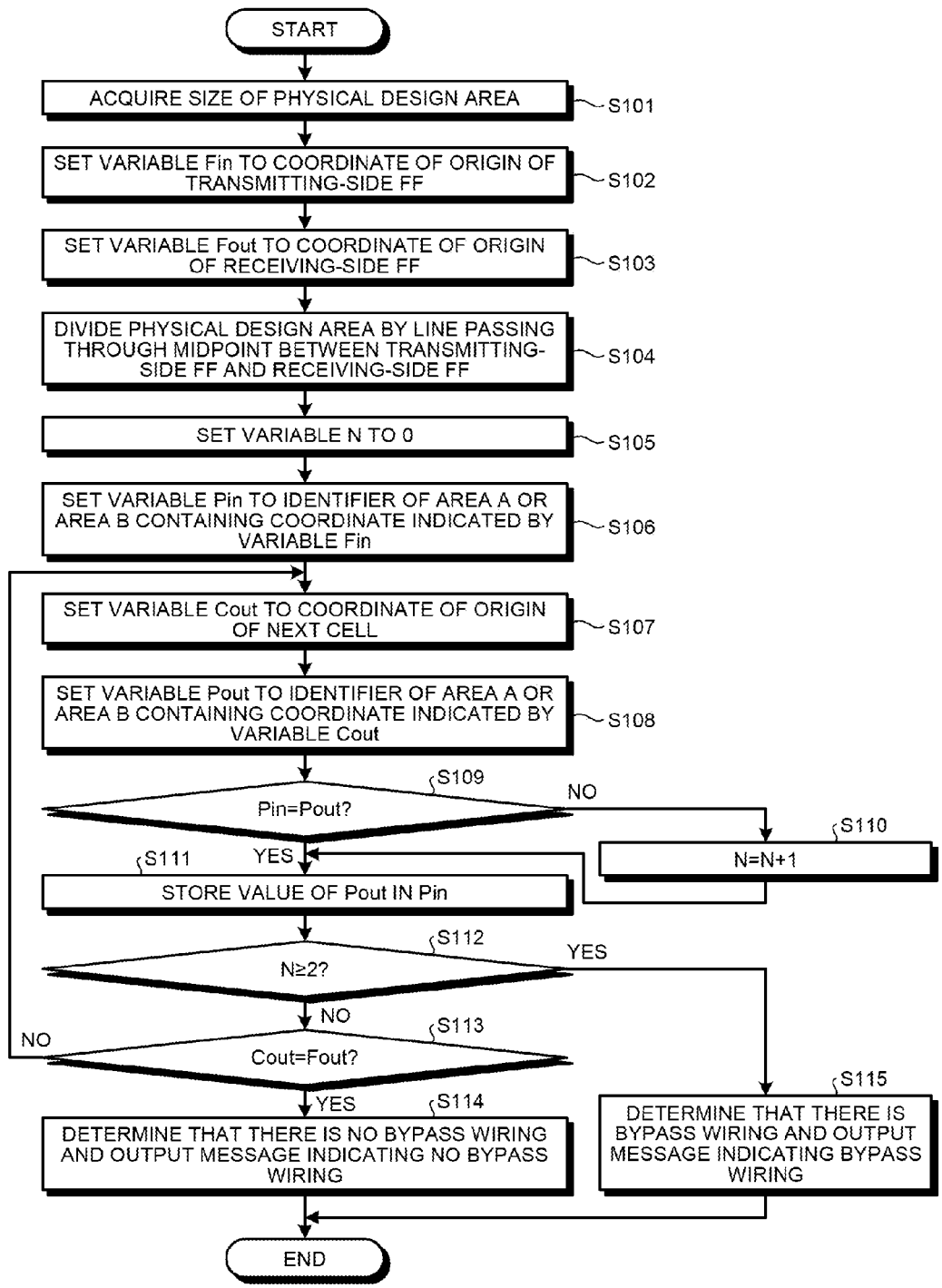
FIG. 8 is a flowchart illustrating a flow of a wiring inspection process according to the first embodiment.

The flow of a process performed by the wiring inspection apparatus 10 according to the first embodiment will be described below. FIG. 8 is a flowchart illustrating the flow of the wiring inspection process according to the first embodiment. The wiring inspection process according to the first embodiment is performed at a timing at which, for example, the control unit 14 receives an instruction to perform the wiring inspection process from the input unit 11. Furthermore, the wiring inspection process according to the first embodiment is performed for each net. Examples of the timing to perform the wiring inspection process include a timing at which a cell is temporarily arranged, a timing at which a clock tree is generated, and a timing at which temporary wiring is performed, in the physical design flow (to be described later).

As illustrated in FIG. 8, the dividing unit 14a acquires the size data 13b from the storage unit 13 (S101). Subsequently, the dividing unit 14a sets the variable Fin to the coordinate of the origin of a cell of a flip-flop that serves as a starting point for transmitting a signal and that is arranged in a physical design area with a size indicated by the size data 13b (S102). Then, the dividing unit 14a sets the variable Fout to the coordinate of the origin of a cell of a flip-flop that serves as an end point for receiving the signal and that is arranged in the physical design area with the size indicated by the size data 13b (S103).

The dividing unit 14a draws a boundary line passing through a midpoint between the cell of the flip-flop serving as the starting point for transmitting the signal and the cell of the flip-flop serving as the end point for receiving the signal in the physical design area, and performs a process as described below. Specifically, the dividing unit 14a divides the physical design area into the area A containing the cell of the flip-flop serving as the starting point and the area B containing the cell of the flip-flop serving as the end point (S104). Subsequently, the dividing unit 14a sets the variable N to "0" (S105). Then, the dividing unit 14a sets the variable Pin to the identifier of either the area A or the area B containing the coordinate indicated by the variable Fin between (S106).

The calculating unit 14b selects a single cell that has not been selected from among a plurality of cells. As a way to select a single cell that has not been selected, the calculating unit 14b selects a single cell located on the most upstream side in the signal flow direction from among cells that have not been selected. Subsequently, the calculating unit 14b sets the variable Cout to the coordinate of the origin of a cell next to the selected cell, that is, the coordinate of the origin of the cell to which the signal flows next from the selected cell (S107).

Then, the calculating unit 14b sets the variable Pout to the identifier of either the area A or the area B containing the coordinate indicated by the variable Cout (S108). Subsequently, the calculating unit 14b determines whether the set value of the variable Pin and the set value of the variable Pout match each other (S109).

If the set value of the variable Pin and the set value of the variable Pout do not match each other (NO at S109), the calculating unit 14b increments the value of the variable N by "1", to thereby update the value of the variable N (S110), and the process proceeds to S111.

If the set value of the variable Pin and the set value of the variable Pout match each other (YES at S109), the calculating unit 14b sets the variable Pin to the value of the variable Pout (S111).

Subsequently, the calculating unit 14b compares the value of the variable N and a predetermined value to determine whether the value of the variable N is equal to or greater than the predetermined value, e.g., two (S112).

If the value of the variable N is not equal to or greater than the predetermined value (NO at S112), the calculating unit 14b determines whether the set coordinate of the variable Cout matches the set coordinate of the variable Fout (S113).

If the set coordinate of the variable Cout does not match the set coordinate of the variable Fout (NO at S113), the calculating unit 14b returns the process to S107. In contrast, if the set coordinate of the variable Cout matches the set coordinate of the variable Fout (YES at S113), the output control unit 14c determines that there is no bypass wiring and performs a process as described below. Specifically, the output control unit 14c causes the output unit 12 to output a message indicating the absence of a bypass wiring (S114), and the process is terminated.

In contrast, if the value of the variable N is equal to or greater than the predetermined value (YES at S112), the output control unit 14c determines that there is a bypass wiring and causes the output unit 12 to output a message indicating the presence of a bypass wiring (S115), and then the process is terminated.

Figure 9:
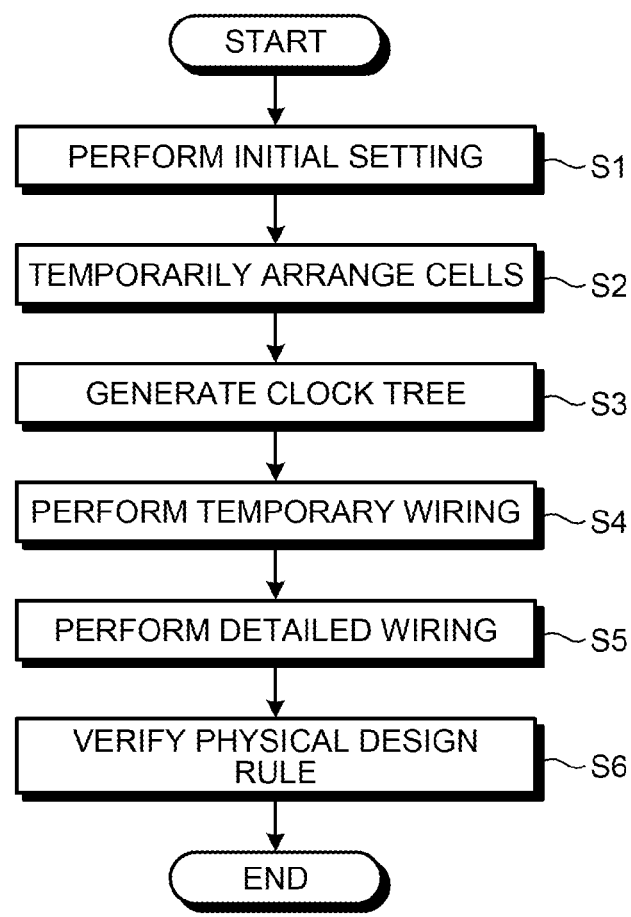
FIG. 9 is a flowchart illustrating a flow of a physical design of a circuit.

A timing to perform the wiring inspection process will be described below. FIG. 9 is a flowchart illustrating the flow of a physical design of a circuit. The physical design illustrated in the example in FIG. 9 is performed by executing a predetermined physical design tool by a computer after completion of a logical design of the circuit. As illustrated in the example in FIG. 9, in the physical design, initial setting is performed first (S1). For example, at S1, a computer receives the size of a physical design area, in which a design block is arranged for each chip of a large scale integration (LSI) designated by a user, a library, and netlist generated by logic synthesis. Furthermore, at S1, the computer sets a fan-out and a frequency. Subsequently, in the physical design, the computer roughly arranges cells (S2). At S2, the computer arranges cells contained in the netlist. Subsequently, in the physical design, the computer generates a clock tree (S3). Then, in the physical design, the computer performs temporary wiring from a clock route pin to a clock terminal of each clock load cell (S4). Subsequently, in the physical design, the computer performs timing analysis and performs detailed wiring based on a result of the timing analysis (S5). Then, in the physical design, the computer checks whether the arranged cells and wirings satisfy a predetermined physical design rule, and if the physical design rule is not satisfied, performs correction (S6).

In the conventional method in which a human visually inspects a circuit after wiring, the human inspects whether there is a bypass wiring by viewing an abnormal portion based on a result of the timing analysis performed at S5 in the physical design as described above. Therefore, in the physical design of the conventional technology, it is difficult to inspect whether there is a bypass wiring in an earlier stage than Step S6. In contrast, the wiring inspection apparatus 10 according to the first embodiment inspects whether there is a bypass wiring by using the location information on the cells. Therefore, the wiring inspection apparatus 10 can perform the wiring inspection process as described above in a stage after Step S3 at which the cells are roughly arranged. Specifically, the wiring inspection apparatus 10 can inspect whether there is a bypass wiring in an earlier stage than Step S6. Therefore, the wiring inspection apparatus 10 can inspect whether there is a bypass wiring in an earlier stage of the physical design. Consequently, because the wiring inspection apparatus 10 can inspect whether there is a bypass wiring in the initial stage of the physical design, it becomes possible to reduce a loss in the process. Furthermore, the wiring inspection apparatus 10 can reduce an influence on the physical design, and therefore can reduce a risk of redesign.

As described above, the wiring inspection apparatus 10 divides the physical design area 20, in which the cell 21 of the transmitting-side flip-flop for transmitting a signal, the cell 22 of the receiving-side flip-flop for receiving a signal, and the cells of latches or the like are arranged, in the manner as described below. Specifically, the wiring inspection apparatus 10 draws a boundary line in a portion of the physical design area 20 between the cell 21 and the cell 22, to thereby divide the physical design area 20 into the area A containing the cell 21 and the area B containing the cell 22. Subsequently, the wiring inspection apparatus 10 calculates the number of wirings that connect cells across the boundary line, based on the positions of the cell 21, the cell 22, and the cells of a plurality of latches or the like in the physical design area 20. If the calculated number of the wirings is equal to or greater than a predetermined value, the wiring inspection apparatus 10 determines that there is a bypass wiring and causes the output unit 12 to output a message indicating the presence of a bypass wiring among the wirings connecting the cells. Therefore, the wiring inspection apparatus 10 can inspect whether there is a bypass wiring based on the location information on each of the cells, without performing a time-consuming process, such as a process of analyzing a wiring pattern based on data of the wiring pattern and inspecting whether there is a bypass wiring based on the analyzed wiring pattern. Consequently, the wiring inspection apparatus 10 can inspect a bypass wiring in a simple and easy manner.

Furthermore, the wiring inspection apparatus 10 draws a boundary line passing through a midpoint between the cell 21 and the cell 22 in the physical design area 20, to thereby divide the physical design area 20 into the area A and the area B. Therefore, the wiring inspection apparatus 10 can detect a bypass wiring located in an intermediate portion between the cell 21 and the cell 22 in the physical design area 20.

Moreover, the wiring inspection apparatus 10 can inspect whether there is a bypass wiring in an earlier stage than Step S6 in the physical design as described above. Therefore, the wiring inspection apparatus 10 can inspect whether there is a bypass wiring in an earlier stage of the physical design. Consequently, because the wiring inspection apparatus 10 can inspect whether there is a bypass wiring in the initial stage of the physical design, it becomes possible to reduce a loss in the process. Furthermore, the wiring inspection apparatus 10 can reduce an influence on the physical design, and therefore can reduce a risk of redesign.

[b] Second Embodiment

A wiring inspection apparatus according to a second embodiment will be explained below. In the first embodiment, a case has been explained that the wiring inspection apparatus 10 draws a single boundary line. In the second embodiment, a case will be explained that the wiring inspection apparatus draws a plurality of boundary lines and performs the same processes as those performed by the wiring inspection apparatus 10 of the first embodiment, for each of the boundary lines.

Figure 10:
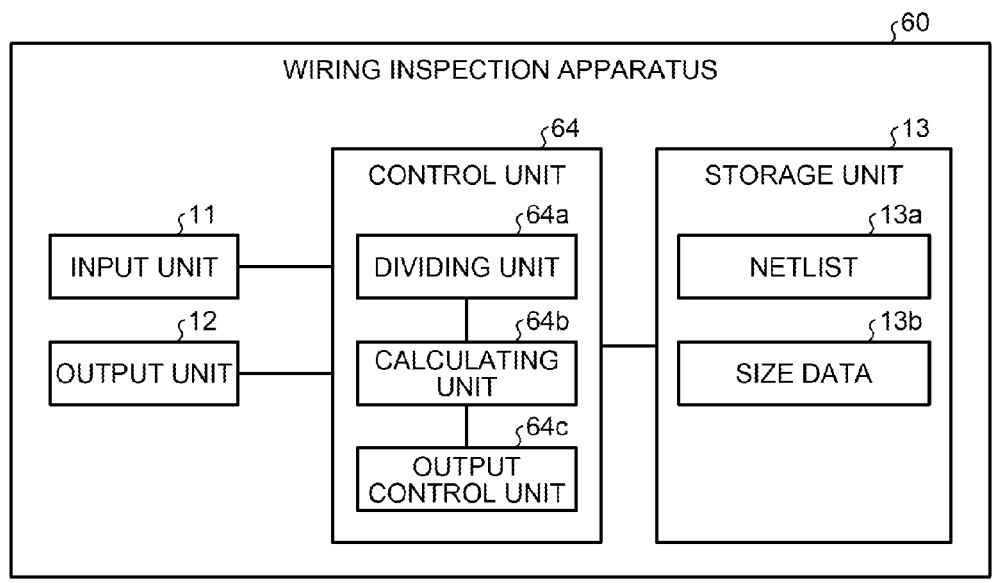
FIG. 10 is a diagram illustrating an example of a functional configuration of a wiring inspection apparatus according to a second embodiment.

FIG. 10 is a diagram illustrating an example of a functional configuration of the wiring inspection apparatus according to the second embodiment. The same functional components as those of the wiring inspection apparatus 10 of the first embodiment as illustrated in FIG. 1 are denoted by the same reference numerals and symbols, and the explanation thereof will be omitted.

Functional Configuration of the Wiring Inspection Apparatus

As illustrated in FIG. 10, a control unit 64 of a wiring inspection apparatus 60 includes a dividing unit 64a, a calculating unit 64b, and an output control unit 64c, instead of the dividing unit 14a, the calculating unit 14b, and the output control unit 14c of the control unit 14 of the first embodiment.

The dividing unit 64a divides the physical design area 20 as described below. Specifically, the dividing unit 64a draws a plurality of boundary lines in a portion of the physical design area 20 between the cell 21 and the cell 22, to thereby divide the physical design area 20 into the area containing the cell 21 and the area containing the cell 22 for each of the boundary lines. An example of the dividing unit 64a will be explained below. For example, similarly to the dividing unit 14a as illustrated in the example in FIG. 2, the dividing unit 64a draws the boundary line 24a that passes through the midpoint 23a between the cell 21 and the cell 22 in the Y-axis direction and that is parallel to the X-axis direction, to thereby divide the physical design area 20 into the area A and the area B. In addition, the dividing unit 64a draws a boundary line that passes through the midpoint between the cell 21 and the cell 22 in the X-axis direction and that is parallel to the Y-axis direction, to thereby divide the physical design area into an area C containing the cell 21 and an area D containing the cell 22.

The calculating unit 64b calculates the number of wirings crossing the boundary line, for each of the boundary lines by using the same calculation method as the method that the calculating unit 14b has employed to calculate the number of wirings crossing the boundary line.

If the number of wirings crossing the boundary line calculated by the calculating unit 64b is equal to or greater than the predetermined value for at least one of the boundary lines, the output control unit 64c determines that there is a bypass wiring. Subsequently, the output control unit 64c causes the output unit 12 to output a message indicating the presence of a bypass wiring among the wirings connecting the cells.

The control unit 64 is a circuit, such as an ASIC, an FPGA, a CPU, or an MPU.

Flow of Process

Figure 11:
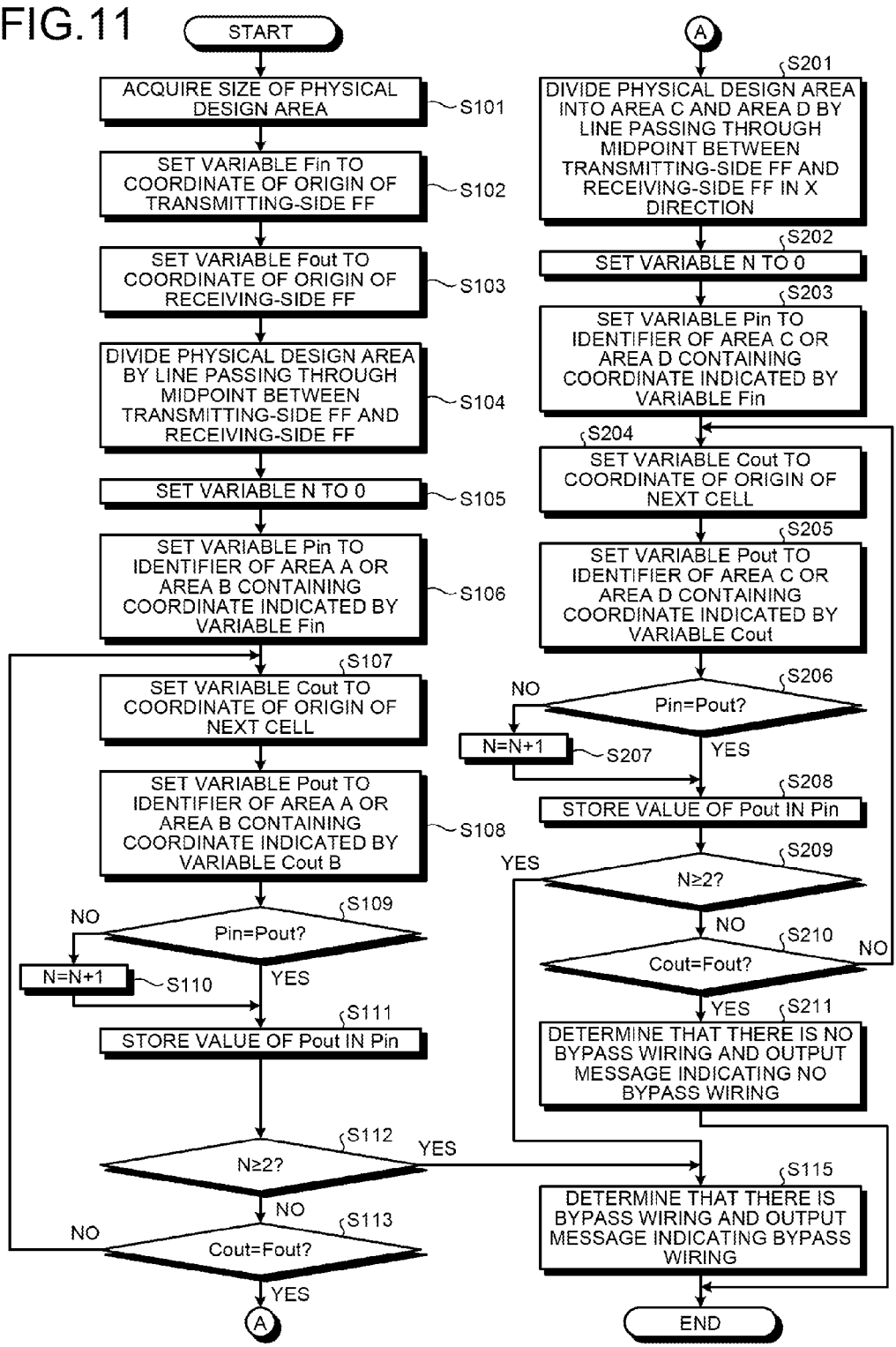
FIG. 11 is a flowchart illustrating a flow of a wiring inspection process according to the second embodiment.

The flow of a process performed by the wiring inspection apparatus 60 according to the second embodiment will be explained below. FIG. 11 is a flowchart illustrating the flow of a wiring inspection process according to the second embodiment. The wiring inspection process according to the second embodiment is performed at the same timing as the wiring inspection process according to the first embodiment. Furthermore, the wiring inspection process according to the second embodiment is performed for each net, similarly to the wiring inspection process according to the first embodiment. Moreover, in the explanation below, the same processes at Steps as those of the wiring inspection process of the first embodiment are denoted by the same Step numbers as the first embodiment, and explanation thereof will be omitted appropriately. Incidentally, among the processes at Steps for which the explanation are omitted, the processes at Steps performed by the dividing unit 14a of the first embodiment are performed by the dividing unit 64a, and the processes at Steps performed by the calculating unit 14b of the first embodiment are performed by the calculating unit 64b. Furthermore, among the processes at Steps for which the explanation are omitted, the processes at Steps performed by the output control unit 14c of the first embodiment are performed by the output control unit 64c.

As illustrated in FIG. 11, at S104, similarly to the example illustrated in FIG. 2, the dividing unit 64a draws the boundary line 24a that passes through the midpoint 23a between the cell 21 and the cell 22 in the Y-axis direction and that is parallel to the X-axis direction, to thereby divide the physical design area 20 into the area A and the area B. Subsequently, if the set coordinate of the variable Cout matches the set coordinate of the variable Fout (YES at S113), the dividing unit 64a performs a process as described below. Specifically, the dividing unit 64a draws a boundary line that passes through a midpoint between the cell 21 and the cell 22 in the X-axis direction and that is parallel to the Y-axis direction, to thereby divide the physical design area 20 into the area C and the area D (S201). Subsequently, the dividing unit 64a sets the variable N to "0" (S202). Then, the dividing unit 64a sets the variable Pin to the identifier of either the area C or the area D containing the coordinate indicated by the variable Fin (S203).

Subsequently, the calculating unit 64b selects a single cell that has not been selected from among a plurality of cells. When selecting a single cell that has not been selected, the calculating unit 64b selects a single cell located on the most upstream side in the signal flow direction among cells that have not been selected. Then, the calculating unit 64b sets the variable Cout to the coordinate of the origin of a cell next to the selected cell, that is, the coordinate of the origin of a cell to which the signal flows next from the selected cell (S204).

Then, the calculating unit 64b sets the variable Pout to the identifier of either the area C or the area D containing the coordinate indicated by the variable Cout (S205). Subsequently, the calculating unit 64b determines whether the set value of the variable Pin and the set value of the variable Pout match each other (S206).

If the set value of the variable Pin and the set value of the variable Pout do not match each other (NO at S206), the calculating unit 64b incrementing the value of the variable N by "1", to thereby update the value of the variable N (S207), and the process proceeds to S208.

If the set value of the variable Pin and the set value of the variable Pout match each other (YES at S206), the calculating unit 64b sets the variable Pin to the value of the variable Pout (S208).

Then, the calculating unit 64b compares the value of the variable N and the predetermined value to determine whether the value of the variable N is equal to or greater than the predetermined value, e.g., 2 (S209).

If the value of the variable N is not equal to or greater than the predetermined value (NO at S209), the calculating unit 64b determines whether the set coordinate of the variable Cout matches the set coordinate of the variable Fout (S210).

If the set coordinate of the variable Cout does not match the set coordinate of the variable Fout (NO at S210), the calculating unit 64b returns the process to S204. In contrast, if the set coordinate of the variable Cout matches the set coordinate of the variable Fout (YES at S210), the output control unit 64c determines that there is no bypass wiring and performs a process as described below. Specifically, the output control unit 64c causes the output unit 12 to output a message indicating the absence of a bypass wiring (S211), and the process is terminated.

In contrast, if the value of the variable N is equal to or greater than the predetermined value (YES at S209), the output control unit 64c determines that there is a bypass wiring and causes the output unit 12 to output a message indicating the presence of a bypass wiring (S115), and then the process is terminated.

As described above, the wiring inspection apparatus 60 divides the physical design area 20, in which the cell 21 of the transmitting-side flip-flop for transmitting a signal, the cell 22 of the receiving-side flip-flop for receiving a signal, and the cells of the latches or the like are arranged, in the manner as described below. Specifically, the wiring inspection apparatus 60 draws a boundary line in a portion of the physical design area 20 between the cell 21 and the cell 22, to thereby divide the physical design area 20 into the area A containing the cell 21 and the area B containing the cell 22. Subsequently, the wiring inspection apparatus 60 calculates the number of wirings that connect cells across the boundary lines, based on the positions of the cell 21, the cell 22, and the cells of a plurality of latches or the like in the physical design area 20. If the calculated number of the wirings is equal to or greater than the predetermined value, the wiring inspection apparatus 60 determines that there is a bypass wiring and causes the output unit 12 to output a message indicating the presence of a bypass wiring among the wirings connecting the cells. Therefore, the wiring inspection apparatus 60 can inspect whether there is a bypass wiring based on the location information on each of the cells, without performing a time-consuming process, such as a process of analyzing a wiring pattern based on data of the wiring pattern and inspecting whether there is a bypass wiring based on the analyzed wiring pattern. Consequently, the wiring inspection apparatus 60 can inspect a bypass wiring in a simple and easy manner.

Furthermore, the wiring inspection apparatus 60 draws the boundary line passing through the midpoint between the cell 21 and the cell 22 in the physical design area 20, to thereby divide the physical design area 20 into the area A and the area B. Therefore, the wiring inspection apparatus 60 can detect the bypass wiring located in an intermediate portion between the cell 21 and the cell 22 in the physical design area 20.

Moreover, the wiring inspection apparatus 60 can inspect whether there is a bypass wiring in an earlier stage than Step S6 in the physical design as described above. Therefore, the wiring inspection apparatus 60 can inspect whether there is a bypass wiring in an earlier stage of the physical design. Consequently, because the wiring inspection apparatus 60 can inspect whether there is a bypass wiring in the initial stage of the physical design, it becomes possible to reduce a loss in the process. The wiring inspection apparatus 60 can also reduce an influence on the physical design, and therefore can reduce a risk of redesign.

Furthermore, the wiring inspection apparatus 60 draws a plurality of boundary lines in a portion of the physical design area 20 between the cell 21 and the cell 22, to thereby divide the physical design area 20 into the area containing the cell 21 and the area containing the cell 22 for each of the boundary lines. Subsequently, the wiring inspection apparatus 60 calculates the number of wirings crossing the boundary line for each of the boundary lines. If the calculated number of wirings crossing the boundary line is equal to or greater than the predetermined value for at least one of the boundary lines, the wiring inspection apparatus 60 determines that there is a bypass wiring. Subsequently, the wiring inspection apparatus 60 causes the output unit 12 to output a message indicating the presence of a bypass wiring among the wirings connecting the cells. As described above, the wiring inspection apparatus 60 calculates the number of wirings crossing the boundary line for each of the boundary lines extending in different directions, and if the calculated number of wirings crossing the boundary line is equal to or greater than the predetermined value for at least one of the boundary lines, the wiring inspection apparatus 60 determines that there is a bypass wiring. Therefore, the wiring inspection apparatus 60 can inspect whether there is a bypass wiring with accuracy.

While the embodiments of the apparatus according to the present invention have been described above, the present invention may be embodied in various forms other than the above-described embodiments. For example, of the processes described in the embodiments, all or part of the processes described as being performed automatically may also be performed manually. Alternatively, all or part of the processes described as being performed manually may also be performed automatically by known methods.

Furthermore, the processes at Steps in any process described in the above embodiments may arbitrarily separated or integrated depending on various loads or use conditions. In some cases, Steps may be omitted.

Moreover, the order of the processes at Steps in any process described in the above embodiments may be changed depending on various loads or use conditions.

Furthermore, the components illustrated in the drawings are functionally conceptual and do not necessarily have to be physically configured in the manner illustrated in the drawings. Specifically, specific forms of distribution and integration of the apparatuses are not limited to those illustrated in the drawings, and all or part of the apparatuses can be functionally or physically distributed or integrated in arbitrary units depending on various loads or use conditions.

Wiring Inspection Program

Figure 12:
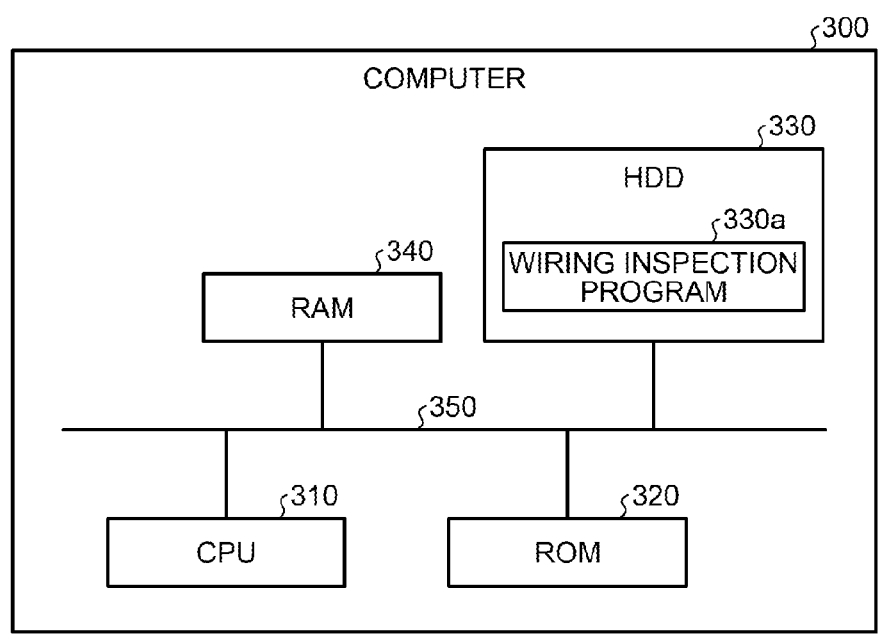
FIG. 12 is a diagram illustrating a computer that executes a wiring inspection program.

The various processes performed by the wiring inspection apparatus 10 or 60 described in the embodiments may be implemented by causing a computer system, such as a personal computer or a workstation, to execute a program provided in advance. Therefore, with reference to FIG. 12, an example of a computer will be explained below that executes a wiring inspection program having the same functions as those of the wiring inspection apparatus 10 or 60 described in the embodiments. FIG. 12 is a diagram illustrating the computer that executes the wiring inspection program.

As illustrated in FIG. 12, a computer 300 includes a CPU 310, a ROM 320, a hard disk drive (HDD) 330, and a RAM 340. The units 310 to 340 are connected to one another via a bus 350.

The ROM 320 stores therein a basic program, such as an operating system (OS). The HDD 330 stores therein, in advance, a wiring inspection program 330*a* that implements the same functions as those of the dividing unit 14*a*, the calculating unit 14*b*, and the output control unit 14*c* described in the embodiments. Alternatively, the HDD 330 stores therein, in advance, the wiring inspection program 330*a* that implements the same functions as those of the dividing unit 64*a*, the calculating unit 64*b*, and the output control unit 64*c* described in the embodiments. Incidentally, the wiring inspection program 330*a* may be separated appropriately. Moreover, the HDD 330 stores therein netlist and size data. The netlist corresponds to the netlist 13*a* as described above, and the size data corresponds to the size data 13*b* as described above.

The CPU 310 reads the wiring inspection program 330*a* from the HDD 330 and executes the wiring inspection program 330*a*.

Furthermore, the CPU 310 reads the netlist and the size data and stores them in the RAM 340. Moreover, the CPU 310 executes the wiring inspection program 330*a* by using the netlist and the size data stored in the RAM 340. Incidentally, all of the data stored in the RAM 340 need not always be stored in the RAM 340. It is sufficient to store, in the RAM 340, data to be used for a process.

Furthermore, the wiring inspection program 330*a* need not always be stored in the HDD 330 from the beginning.

For example, the wiring inspection program 330*a* may be stored in a "portable physical medium", such as a flexible disk (FD), a compact disk-ROM (CD-ROM), a digital versatile disk (DVD), a magnetooptical disk, or an integrated circuit (IC) card, that is insertable into the computer 300. Then, the computer 300 reads the wiring inspection program 330*a* from the medium and executes the wiring inspection program 330*a*.

Alternatively, the wiring inspection program 330*a* may be stored in "other computers (or servers)" connected to the computer 300 via a public line, the Internet, a local area network (LAN), or a wide area network (WAN). Then, the computer 300 reads the wiring inspection program 330*a* from the other computer or servers and executes the wiring inspection program 330*a*.

According to an aspect of the present invention, it is possible to inspect a bypass wiring in a simple and easy manner.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring inspection apparatus comprising:
a dividing unit that draws a boundary line in a portion of a predetermined area between a transmission component and a reception component that are arranged in the predetermined area, to divide the predetermined area into a first area containing the transmission component and a second area containing the reception component, the transmission component configured to transmit a signal to the reception component via a plurality of relay components;
a calculating unit that calculates a number of wirings that connect the components across the boundary line, based on positions of the transmission component, the reception component, and the relay components in the predetermined area; and
an output unit that outputs information indicating presence of a wiring extending in a direction opposite to a direction from the transmission component to the reception component among wirings connecting the components when the number of the wirings calculated by the calculating unit is equal to or greater than a predetermined value.

2. The wiring inspection apparatus according to claim 1, wherein
the dividing unit draws a plurality of boundary lines extending in different directions in a portion of the predetermined area between the transmission component and the reception component, to divide the predetermined area into the first area and the second area for each of the boundary lines,
the calculating unit calculates the number of the wirings for each of the boundary lines, and
the output unit outputs the information when the number of the wirings calculated by the calculating unit is equal to or greater than the predetermined value for at least one of the boundary lines.

3. The wiring inspection apparatus according to claim 1, wherein the dividing unit draws a boundary line passing through a midpoint between the transmission component and the reception component in the predetermined area, to divide the predetermined area into the first area and the second area.

4. A non-transitory computer-readable recording medium having stored therein a program that causes a computer to execute a wiring inspection process comprising:
drawing a boundary line in a portion of a predetermined area between a transmission component and a reception component that are arranged in the predetermined area, dividing the predetermined area into a first area containing the transmission component and a second area containing the reception component, the transmission component configured to transmit a signal to the reception component via a plurality of relay components;
calculating a number of wirings that connect the components across the boundary line, based on positions of the transmission component, the reception component, and the relay components in the predetermined area; and
determining that there is a wiring extending in a direction opposite to a direction from the transmission component to the reception component among wirings connecting the components when the number of the wirings calculated at the calculating is equal to or greater than a predetermined value.

5. A wiring inspection method performed by a computer, comprising:
drawing, by the computer, a boundary line in a portion of a predetermined area between a transmission component and a reception component that are arranged in the predetermined area, dividing the predetermined area into a first area containing the transmission component and a second area containing the reception component, the transmission component configured to transmit a signal to the reception component via a plurality of relay components;
calculating, by the computer, a number of wirings that connect the components across the boundary line, based on positions of the transmission component, the reception component, and the relay components in the predetermined area; and
determining, by the computer, that there is a wiring extending in a direction opposite to a direction from the transmission component to the reception component among wirings connecting the components when the number of the wirings calculated at the calculating is equal to or greater than a predetermined value.

* * * * *